United States Patent [19]

Riyono

[11] Patent Number: 4,489,281
[45] Date of Patent: Dec. 18, 1984

[54] AUTOMATIC GAIN CONTROL AMPLIFIER LEFT AT AN OPTIMUM GAIN AFTER AN END OF A DIGITAL INPUT SIGNAL

[75] Inventor: Mikio Kiyono, Tokyo, Japan

[73] Assignee: Nippon Electric Co., Ltd., Tokyo, Japan

[21] Appl. No.: 480,613

[22] Filed: Mar. 30, 1983

[30] Foreign Application Priority Data

Mar. 30, 1982 [JP] Japan .................................. 57-51588

[51] Int. Cl.$^3$ .............................................. H03G 3/20
[52] U.S. Cl. ...................................... 330/129; 330/278
[58] Field of Search ............... 330/129, 138, 278, 279, 330/280

[56] References Cited

U.S. PATENT DOCUMENTS 3,969,683 7/1976 Fabricius ........................ 330/129 X
4,360,787 11/1982 Galpin ............................ 330/129 X

OTHER PUBLICATIONS

Kerdock, R. S., et al., "Results of the Atlanta Experiments", *Bell System Tech. J.*, vol. 57, No. 6, Jul.-Aug. 1978, pp. 1857-1879.

Primary Examiner—James B. Mullins
Assistant Examiner—Steven J. Mottola

Attorney, Agent, or Firm—Sughrue, Mion, Zinn, Macpeak, and Seas

[57] ABSTRACT

In an automatic gain control amplifier circuit for an intermittent sequence of digital input signals, a signal detector detects presence and absence of the digital input signal in the sequence to produce a presence signal which takes a presence and an absence level when the digital input signal is present and absent, respectively. The presence signal takes the absence level even upon undesired occurrence of an interruption in one of the digital input signals. A level comparator compares an amplified level of a digital output signal of the amplifier circuit with a reference level, which is preferably equal to an optimum level common to the digital output signals, to produce a comparison result signal which takes a first and a second level when the amplified level is higher and lower than the reference level, respectively. An up-down counter is preset to a predetermined count upon switch on of a power source for the amplifier circuit and is enabled by the presence level to count up and down clocks of the digital input signal from the predetermined count when the comparison result signal takes one and the other of the first and the second levels, respectively. A gain control signal is produced in consideration of the count in the up-down counter.

5 Claims, 7 Drawing Figures

AUTOMATIC GAIN CONTROL AMPLIFIER LEFT AT AN OPTIMUM GAIN AFTER AN END OF A DIGITAL INPUT SIGNAL

BACKGROUND OF THE INVENTION

This invention relates to an automatic gain control amplifier circuit for use in a receiver for an intermittent sequence of data transmission signals.

In a data transmission network, a receiver must receive data transmission signals from a plurality of transmitters in an intermittent sequence. The data transmission signals are received with different intensities or levels. When the receiver is connected to the transmitters by a solid transmission medium comprising paired cables, coaxial cables, optical cables, or the like, the intensities are dependent on distances along the transmission medium between the receiver and the respective transmitters and are scarcely variable with time. At any rate, the receiver must include an automatic gain control amplifier circuit for amplifying the respective data transmission signals into digital output signals of an optimum level common to the digital output signals.

As will later become clear as the description proceeds with reference to several figures of the accompanying drawing, the intermittent sequence of data transmission signals are supplied to the automatic gain control amplifier circuit as an intermittent sequence of digital input signals. The amplifier circuit has a variable gain which is controlled for the respective digital input signals by a gain control signal so as to give the digital output signals the optimum level. The variable gain is adjusted with an appreciably long delay as compared with the transmission rate of each data transmission signal in order to insure stable operation of the amplifier circuit.

In a conventional automatic gain control amplifier circuit, the variable gain is rendered a maximum during each pause between two adjacently successive digital input signals. Under the circumstances, an unduly long recovery time is necessary before each digital input signal is amplified to the optimum level. This reduces the transmission efficiency of the data transmission network. The unduly long recovery time is indispensable also upon undesired occurrence of a momentary interruption in a certain one of the data transmission signals as referred to, for example, in an article contributed by R. S. Kerdock et al to the Bell System Technical Journal, Vol. 57, No. 6 (July-August 1978), under the title of "Results of Atlanta Experiments," on page 1873 and elsewhere.

SUMMARY OF THE INVENTION

It is therefore an object of the present invention to provide an automatic gain control amplifier circuit of a receiver for use in a data transmission network, which circuit will not degrade the transmission efficiency of the network.

It is another object of this invention to provide an automatic gain control amplifier circuit of the type described, which is capable of quickly giving an optimum level to an amplified signal next following a pause or an undesired interruption.

An automatic gain control amplifier circuit to which this invention is applicable, is for an intermittent sequence of digital input signals. The amplifier circuit comprises variable gain amplifying means responsive to a gain control signal for amplifying each digital input signal to produce a digital output signal and control signal producing means responsive to the digital output signal for producing the gain control signal. According to this invention, the control signal producing means comprises first and second means as follows.

The first means is responsive to the digital output signal for detecting presence and absence of the digital input signal in the intermittent sequence to produce a presence signal which takes a presence and an absence level when the digital input signal is present and absent in the intermittent sequence, respectively.

The second means is responsive to the digital output signal and the presence signal for producing the gain control signal when the presence signal takes the presence level. The second means makes the gain control signal keep a specific value while the presence signal takes the absence level. The specific value, as herein called, is had by the gain control signal at an instant at which the presence signal is switched from the presence level to the absence level.

DESCRIPTION OF THE PREFERRED EMBODIMENTS

Figure 1:
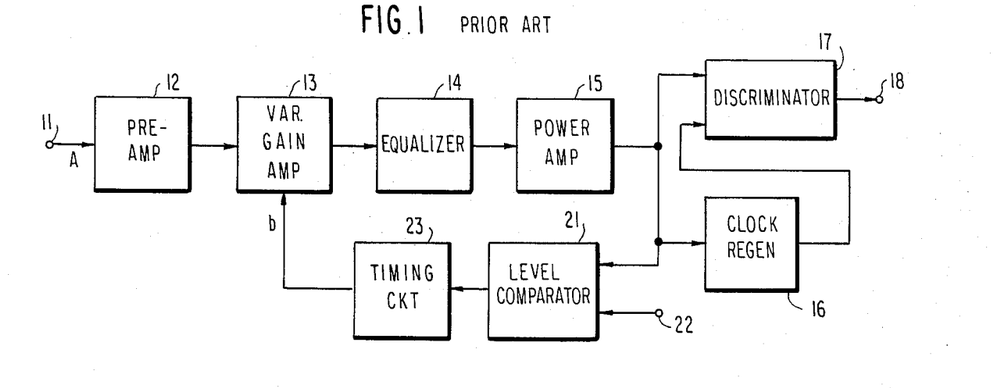
FIG. 1 is a block diagram of a conventional automatic gain control amplifier circuit and related circuitry of a receiver for an intermittent sequence of data transmission signals.
Figure 2:
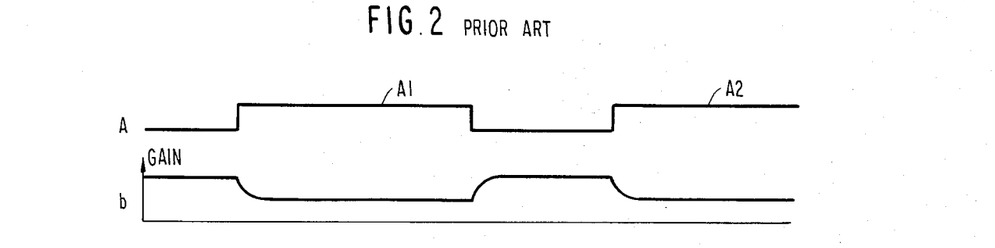
FIG. 2 schematically shows a few signals used in the amplifier circuit depicted in FIG. 1.

Referring to FIGS. 1 and 2, a conventional automatic gain control amplifier circuit will be described at first in order to facilitate an understanding of the present invention. The amplifier circuit is for use in a receiver for an intermittent sequence of data transmission signals and has a circuit input terminal 11 to which a first digital input signal A1, a second digital input signal A2, and so forth of an intermittent sequence A (also depicted in FIG. 2) are supplied in response to the respective data transmission signals in the manner known in the art.

Each digital input signal A (suffix omitted) is preamplified by a preamplifier 12 into a preamplified signal. A variable gain amplifier 13 is for amplifying the preamplified signal to produce an amplifier output signal with a variable gain controlled by a gain control signal b (also in FIG. 2) which will presently be discussed in detail. An equalizer 14 is for shaping the waveform of the amplifier output signal to produce an equalized signal. A power amplifier 15 is for amplifying the equalized signal to produce an amplified signal of a certain amplified level. The amplified signal may be referred to as a digital output signal.

Responsive to the digital output signal, a clock regenerator 16 regenerates a sequence of clocks used in providing the data transmission signal supplied to the circuit input terminal 11 as that one of the digital input signals A's which is amplified into the digital output signal under consideration. The receiver comprises a discriminator 17 responsive to the clock sequence for reproducing data carried by the data transmission signal in question from the digital output signal to deliver the reproduced data to a data output terminal 18.

A level or voltage comparator 21 is for comparing the amplified level with a reference level indicated at 22. The level comparator 21 produces a comparison result signal which takes a first and a second result level when the amplified level is higher and lower than the reference level, respectively. For the conventional amplifier circuit being illustrated, the comparison result signal should have a level which is variable in steps either between or beyond the first and the second result levels when the amplified level stepwise varies. Responsive to such a comparison result signal, a timing circuit 23 supplies the gain control signal b to the variable gain amplifier 13 as will shortly be discussed in detail. The level comparator 21 and the timing circuit 23 provide an automatic gain control loop for the variable gain amplifier 13.

In operation, the gain control signal b takes a first predetermined level while the comparison result signal takes the second result level due to absence of the digital input signal A in the intermittent sequence A as shown in FIG. 2 at A and b. The first predetermined level gives a maximum gain to the variable gain amplifier 13. Upon start of the first digital input signal A1, the comparison result signal is switched from the second result level to the first result level. The gain control signal b is adjusted to reduce the variable gain as shown in FIG. 2 at b. As a result of a reduction in the variable gain, the amplified level may become lower than the reference level. In this event, the comparison result signal is made to take the second result level. The gain control signal b raises the variable gain.

In this manner, the amplified level eventually stabilises at an optimum level. At this instant, the gain control signal b is given a second predetermined level. The gain control signal b is stably kept at the second predetermined level insofar as the first digital input signal A1 is continuously supplied to the circuit input terminal 11.

When the first digital input signal A1 comes to an end, the comparison result signal is switched from the first result level to the second result level. The gain control signal b is adjusted towards the first predetermined level. The variable gain is thereby raised towards the maximum gain.

When the second digital input signal A2 appears after a pause following the end of the first digital input signal A1, the variable gain is again reduced as described before. It is to be noted here that the timing circuit 23 ordinarily varies the gain control signal b with an appreciably long delay as compared with the transmission rate of each of the data transmission signals. This is in order to insure stable operation of the automatic gain control loop. The long delay results in a considerably long recovery time relative to appearance and disappearance of each digital input signal A as exemplified in FIG. 2 at A and b. The amplifier circuit is therefore defective in that an objectionably long interval of time is necessary after start of reception of each digital input signal A until the reception is optimally carried out. The objectionably long interval is likewise necessary upon occurrence of an undesired interruption in each digital input signal A. Such a defect of the amplifier circuit results in reduction in the transmission efficiency of the data transmission network.

Figure 3:
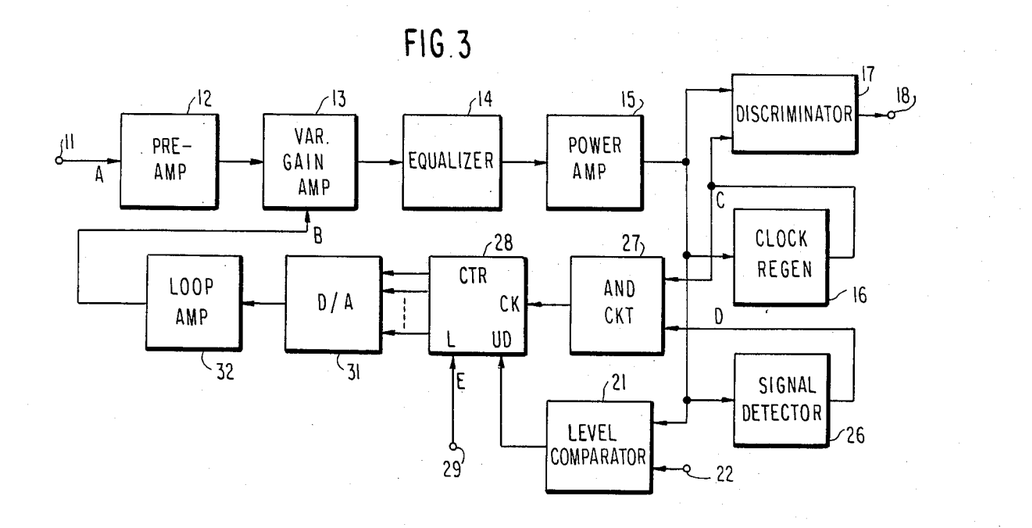
FIG. 3 is a block diagram of an automatic gain control amplifier circuit according to a first embodiment of the instant invention and related circuitry of a receiver of the type described in conjunction with FIG. 1.
Figure 4:
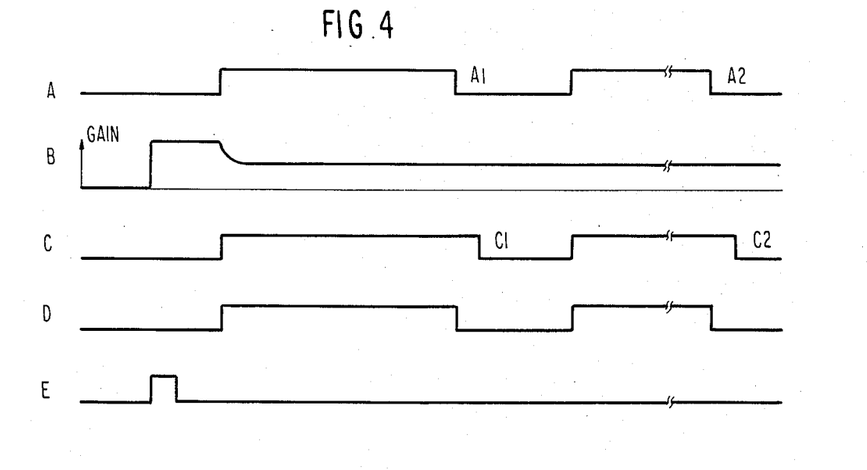
FIG. 4 schematically shows several signals for use in describing operation of the amplifier circuit illustrated in FIG. 3.

Referring now to FIGS. 3 and 4, an automatic gain control amplifier circuit according to a first embodiment of this invention is again for use in a receiver for an intermittent sequence of data transmission signals. The amplifier circuit being illustrated, comprises similar parts designated by like reference numerals. The variable gain amplifier 13 is, however, supplied with the gain control signal, which will now be designated by B (also in FIG. 4) and is produced as will soon be described in the following. Incidentally, the clock regenerator 16 regenerates first, second, and other clock sequences C1, C2, and so forth intermittently in response to the respective digital output signals and consequently in response to the first, the second, and like digital input signals A1, A2, and so on as exemplified in FIG. 4 at C by an envelope.

The illustrated automatic gain control amplifier circuit comprises a signal detector 26 responsive to each digital output signal for detecting presence and absence of the digital input signals A's in the intermittent sequence A to produce a presence signal D, which may take a high and a low level as illustrated in FIG. 4 during presence and absence of the digital input signal A in the intermittent sequence A, respectively. The high and the low levels may be called a presence and an absence level, respectively.

The presence signal D is supplied to an AND circuit 27 for the clock sequences C's. The AND circuit 27 is enabled only while the presence signal D takes the presence level. The AND circuit 27 therefore delivers the clocks of each clock sequence C to a clock input terminal CK of an up-down counter 28 only in the presence of the digital input signal A.

A preset input terminal 29 of the automatic gain control amplifier circuit is for automatically or otherwise supplying a load or preset signal E to a load or preset input terminal L of the up-down counter 28 upon switch on of a power source (not shown) for the receiver. The counter 28 furthermore has an up-down count control terminal UD supplied with the comparison result signal from the level comparator 21. The load signal E is for presetting a predetermined count in the counter 28 to make the gain control signal B take a first value which is prescribed as will presently become clear. As is the case with the first predetermined level used in the automatic gain control amplifier circuit illustrated with reference to FIGS. 1 and 2, the first value is for rendering the variable gain of the variable gain amplifier 13 maximum. The intermittent sequence A of digital input signals A1, A2, and the like is thereafter supplied to the circuit input terminal 11.

Whenever the comparison result signal takes the first result level described in conjunction with FIG. 1, the presence signal D always takes the presence level although the converse is not necessarily true. The comparison result signal of the first result level makes the up-down counter 28 count down the count from the predetermined count in compliance with the clocks of the clock sequence C and produces a count signal representative of the count. Even when the comparison result signal takes the second result level, the presence signal D may take the presence level. In this event, the counter 28 counts up the count in response to the clocks C. Such a count signal is produced to a counter output line, which in practice consists of a plurality of counter output leads as depicted in FIG. 3.

When the presence signal D takes the absence level, the comparison result signal always takes the second result level. The up-down counter 28 is put in a state of counting down the clocks C of the clock sequence C1, C2, or the like. The counter 28 is, however, disabled by the presence signal D of the absence level to neither count up the count nor count down but retain a specific count to which the counter 28 has either counted down or up the clocks C from appearance of the presence level in the presence signal D until the presence signal D is switched from the presence level to the absence level. In other words, the specific count is a count at an instant at which the digital input signal A is either suspended or subjected to an undesired interruption. It is now understood that the comparison result signal need not take one of an appreciable number of levels at a time but may only take one and the other of the first and the second result levels and that the level comparator 21 may be simplified in structure as compared with that used in the conventional automatic gain control amplifier circuit.

A digital-to-analog converter 31 is for converting the count signal to an analog signal of an analog level representative of the count. A loop amplifier 32 smooths the analog signal into a smoothed signal and then amplifies the smoothed signal into the gain control signal B of a gain control level, which is representative of the analog level. Upon smoothing, the loop amplifier 32 gives a predetermined delay to the smoothed signal. The delay depends upon a time constant of a smoothing circuit comprised by the loop amplifier 32. The gain control level is therefore dependent with the predetermined delay on the count in the up-down counter 28.

The first value of the gain control signal B corresponds to the predetermined count preset by the load signal E in the up-down counter 28. Upon start of reception of the first digital input signal A1, the gain control level decreases from the first value dependent with the delay on the count because the variable gain of the variable gain amplifier 13 is maximum when the gain control signal B takes the first value. The amplified level may subsequently become lower than the reference level due to the reduction in the gain control level if the reference level is considerably high. Under the circumstances, the gain control level is raised.

In FIG. 4, it is presumed that the reference level is set at a value such that the gain control level decreases to a second value at which the variable gain amplifier 13 makes the digital output signal have an optimum level. More particularly, the reference level is rendered substantially equal to the optimum level common to the digital output signals into which the respective digital input signals A1, A2, and so forth are amplified. Under the circumstances, the gain control signal B produced for the first digital input signal A1 is kept at the second value either upon occurrence of an undesired interruption in the first digital input signal A1 until recovery thereof or upon arrival at the end of the first digital input signal A1 until appearance of the second digital input signal A2.

It is to be noted in this connection that the second value is specific to each digital input signal A. This is because each digital input signal A has a level dependent on the intensity of the data transmission signal which is supplied to the circuit input terminal 11 as the digital input signal under consideration. The second value will therefore be named a specific value. The specific value corresponds with the predetermined delay to the specific count mentioned heretobefore.

When the second digital input signal A2 has a level which is different from that of the first digital input signal A1, the up-down counter 28 will count up or down the clocks of the second clock sequence C2. The gain control signal B, however, quickly reaches a specific value for the second digital input signal A2.

It will now readily be understood that the gain control signal B is substantially kept at the specific value until either appearance of a next following digital input signal A or switch off of the power source. If a first specific value should be followed by a second specific value which is not equal to the first specific value, the up-down counter 28 counts up or down the clocks of the clock sequence regenerated for the digital input signal being dealt with, to control the gain control level and to adjust the variable gain of the variable gain amplifier 13. The digital output signal is again given the optimum level which is common to every digital output signal. It is thus possible to carry out the automatic gain control without a material delay except at the start of reception of an intermittent digital input signal sequence that next follows switch on of the power source.

Figure 5A:
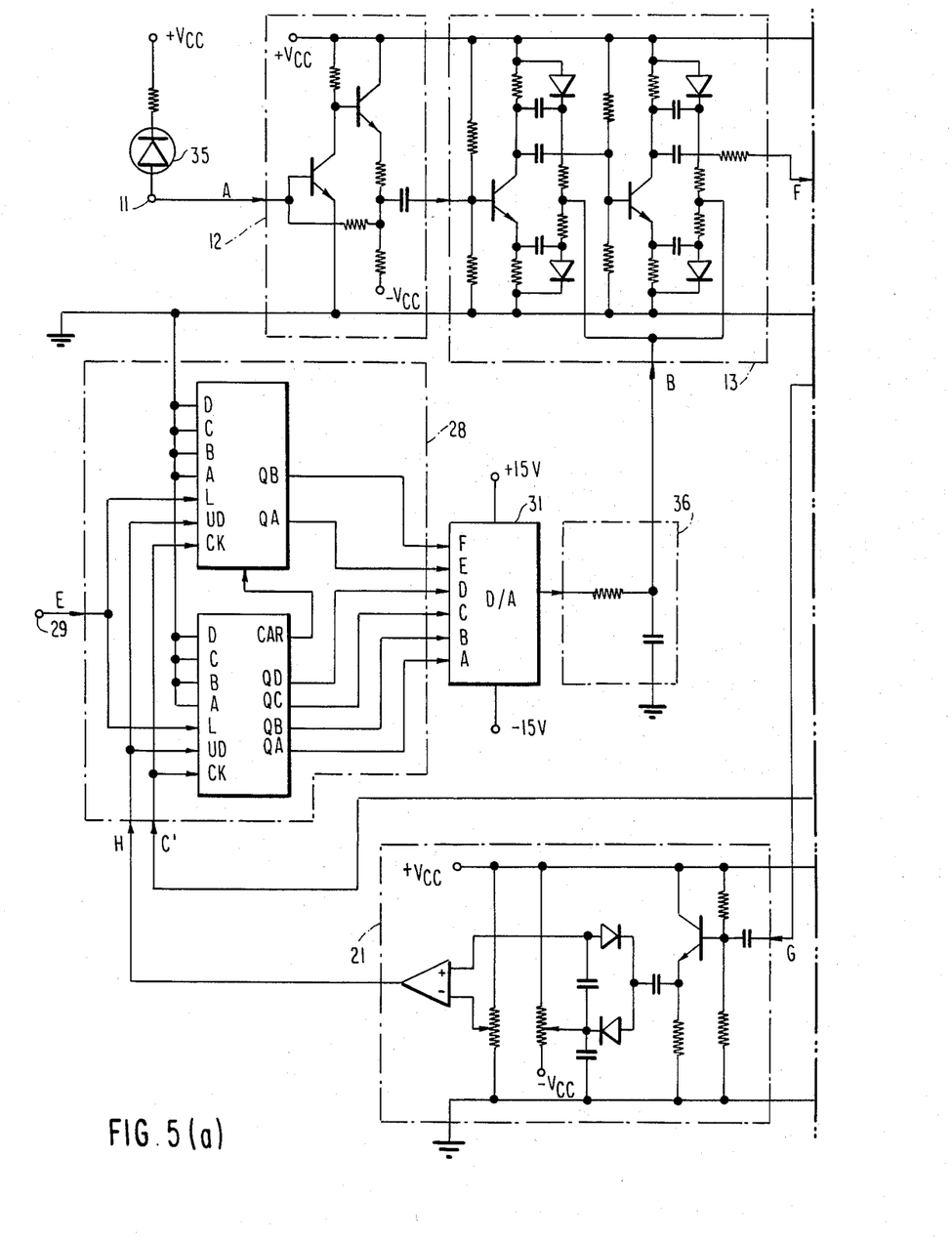
FIGS. 5(a) and 5(b), when connected side by side, show an automatic gain control amplifier circuit according to a second embodiment of this invention partly in blocks, together with related circuitry of a receiver of the type described in connection with FIG. 1 or 3.
Figure 5B:
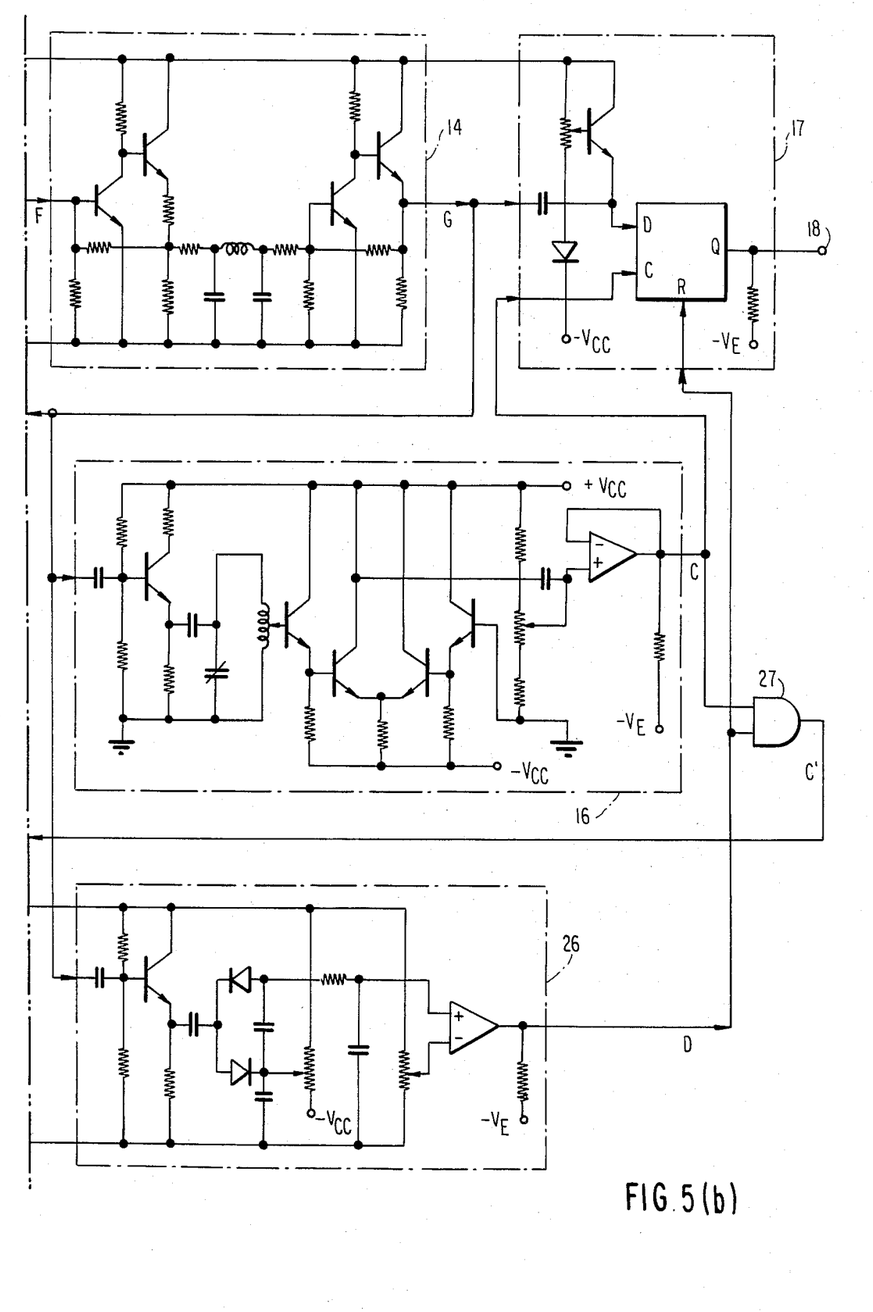
Figure 6:
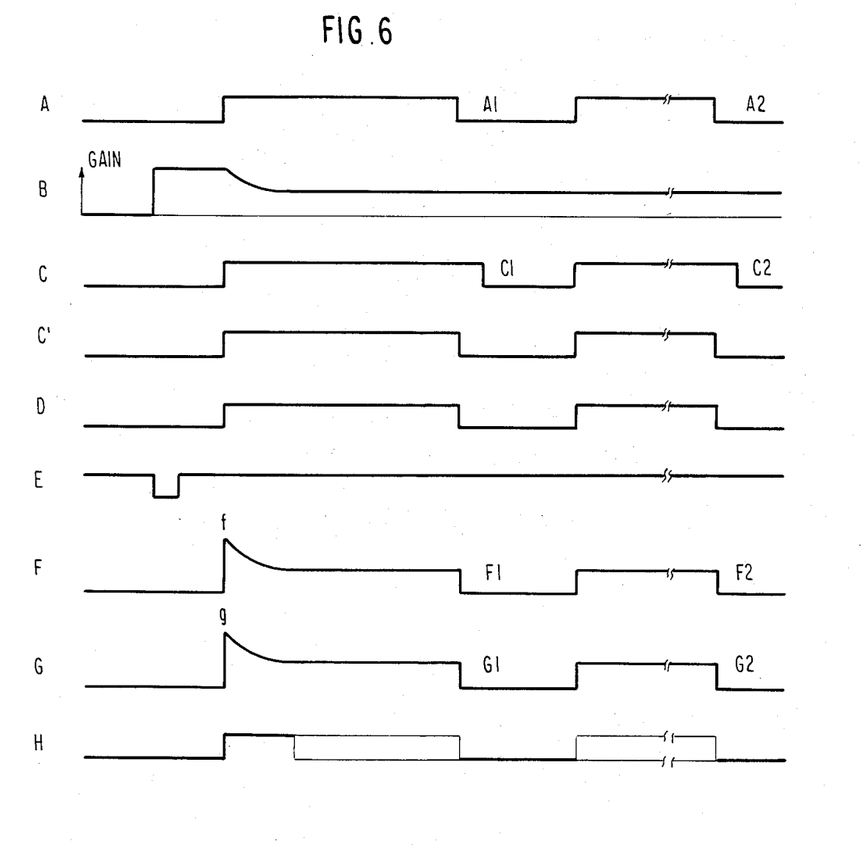
FIG. 6 schematically shows several signals for use in describing operation of the amplifier circuit depicted in FIGS. 5(a) and 5(b).

Turning now to FIGS. 5(a), 5(b), and 6, an automatic gain control amplifier circuit according to a second embodiment of this invention is for a receiver of an intermittent sequence of optical data transmission signals and comprises similar parts designated by like reference numerals. The power amplifier 15 is not used separately of the equalizer 14. The receiver comprises a photodiode 35 for detecting the optical data transmission signals transmitted thereto in succession through an optical fiber (not shown).

Like in FIG. 4, waveforms are illustrated in FIG. 6 at A through E for the first, the second, and the like digital input signals A1, A2, and so forth, the gain control signal B, the first, the second, and the like clock sequences C1, C2, and so on, the presence signal D, and the load signal E. The clocks produced by the AND circuit 27 are depicted at C' for the respective clock sequences C1 and C2. The AND circuit 27 may be MECL 10125 manufactured and sold by Motrola. The load signal E is shown in a shape which is somewhat different from that depicted in FIG. 4. This is for harmonizing the load signal E to the up-down counter 28, for which use is made of 74S169 manufactured and sold by Texas Instruments. Incidentally, the discriminator 17 is supplied with the presence signal D.

First, second, and other amplifier output signals are depicted at F1, F2, and others which are produced in response to the first, the second, and the like digital input signals A1, A2, and so forth, respectively. First, second, and like digital output signals are illustrated at G1, G2, and so on for the respective digital input signals A1, A2, and others.

The up-down counter 28 is preset by the load signal E to the predetermined count as described hereinabove. For the example being illustrated, the predetermined count may alternatively be called an initial count. At this instant, the count signal represents a logic value "000000" to represent the initial count. When the digital-to-analog converter 31 is a μPC 603 D manufactured and sold by Nippon Electric Co., Ltd., of Tokyo, Japan, the analog signal takes an analog level of 10 volts for the initial count.

Instead of the loop amplifier 23 described in conjunction with FIG. 3, a low-pass filter 36 is used in merely smoothing the analog signal to produce the smoothed signal as the gain contral signal B. When the count signal represents the initial count, the variable gain amplifier 13 is given a maximum gain as depicted in FIG. 6 at B and as described heretobefore.

When the first digital input signal A1 is supplied to the circuit input terminal 11 in the meanwhile, the variable gain amplifier 13 produces the first amplifier output signal F1 with a maximum level as indicated in FIG. 6 at f. The equalizer 14 now produces the equalized signal as the first digital output signal G1 with a maximum amplified level as illustrated in FIG. 6 at g.

The level comparator 21 produces in this event the comparison result signal of a logic one level as depicted in FIG. 6 at H. The logic one level corresponds to the first result level described before. At any rate, the signal detector 26 produces the presence signal D with the presence level which is depicted in FIG. 6 as a high level. In the illustrated example, the up-down counter 28 counts up the clocks C' delivered thereto from the AND circuit 27 rather than counts down the clocks C'.

The up-down counter 28 counts up towards a full count of logic "111111." If the counter 28 actually counts up to the full count, the gain control signal B would reduce the variable gain of the variable gain amplifier 13 to a minimum. The first digital output signal G1 would have a scarcely appreciable level (not shown).

In the actual case, the first digital output signal G1 is produced by the equalizer 14 eventually with an optimum level of about 1 volt. In the level comparator 21 being illustrated, the reference level is given by an adjustable resistor voltage divider. As described in conjunction with FIGS. 3 and 4, the reference level is rendered substantially equal to the optimum level common to the digital output signals G's.

When the amplified level of the first digital output signal G1 decreases below the optimum level, the level comparator 21 gives the comparison result signal H a logic zero level as the second result level. The presence signal D still keeps the presence level insofar as the first digital input signal A1 is continuously supplied to the circuit input terminal 11. In this event, the up-down counter 28 counts down the clocks C'.

As pointed out above, the low-pass filter 36 has an appreciably large time constant in order to insure stable operation of the automatic gain control loop. As a consequence, the amplified level of the first digital output signal G1 alternatingly decreases and increases near that level of equilibrium which is equal to the optimum level. After lapse of a delay corresponding to the time constant, the level of the first digital output signal G1 is stabilized to the optimum level.

When the first digital input signal A1 comes to an end, the signal detector 26 gives the presence signal D a low level as the absence level indicative of absence of the digital input signals A's in the intermittent input sequence A. The comparison result signal H is given the logic zero level without fail. Although the logic zero comparison result signal H indicates count down at the up-down counter 28, no clocks C's are supplied thereto from the AND circuit 27. The counter 28 therefore retains the specific count to which the counter 28 has either counted up or down the clocks C' immediately before disappearance of the first digital input signal A1.

When the second digital input signal A2 appears next following a pause between the first and the second digital input signals A1 and A2, the second digital output signal G2 is given an amplified level dependent on the intensity of the second digital input signal A2 and on a specific value had by the gain control signal B at an instant at which the presence signal D is switched from the presence level to the absence level at the end of the first digital input signal A1. Depending on the amplified level of the second digital output signal G2, the comparison result signal H takes either the first result level (high) or the second result level (low). The up-down counter 28 may therefore either count up or down the clocks C' of the second clock sequence C2. In either event, the levels of the second digital output signal G2 and of the control signal B reach the optimum level and a specific value specific to the second digital input signal A2 quickly in an interval of time which is unexpectedly shorter than the interval for the first digital input signal A1 and accordingly than the interval indispensable in the conventional automatic gain control amplifier circuit.

Even if a momentary interruption undesiredly takes place in the digital input signal A1 or A2 for some reason or another, the gain control signal B is kept at the specific value for the digital input signal A1 or A2 in question throughout the interruption. Inasmuch as the digital input signal A1 or A2 reappears with the level had before the interruption, the digital output signal G1 or G2 is substantially instantaneously given the optimum level.

While only two preferred embodiments of this invention have thus far been described, it will now readily be feasible for one skilled in the art to carry this invention into effect in various other manners. It is to be noted as will be clear from the illustration with reference to FIGS. 3 (and 4) and 5(a) and 5(b) (and 6) that the up-down counter 28 may count up and down the clocks C' (in FIG. 6) when the comparison result signal H (in FIG. 6) takes a predetermined one and the other of the first and the second result levels. The first and the second result levels may be referred to merely as a first and a second level depending on the circumstances.

What is claimed is:

1. An automatic gain control amplifier circuit for an intermittent sequence of digital input signals, comprising variable gain amplifying means responsive to a gain control signal for amplifying each digital input signal to produce a digital output signal and control signal producing means responsive to said digital output signal for producing said gain control signal, wherein said control signal producing means comprises:

first means responsive to said digital output signal for detecting presence and absence of the digital input signal in said intermittent sequence to produce a presence signal which takes a presence and an absence level when the digital input signal is present and absent in said intermittent sequence, respectively; and second means responsive to said digital output signal and said presence signal for producing said gain control signal when said presence signal takes said presence level, said second means making said gain control signal keep a specific value while said presence signal takes said absence level, said specific value being had by said gain control signal at a instant at which said presence signal is switched from said presence level to said absence level;

wherein said first means comprises a signal detector responsive to said digital output signal and producing a presence signal having a presence level concurrent with a sequence of digital input signals and an absence level whenever there is no digital input signal;

a clock regenerator responsive to said digital output signal for regenerating a clock sequence of clocks of the digital input signal amplified into said digital output signal;

counter means responsive to said digital output signal and said presence signal for counting the clocks of said clock sequence in consideration of an amplified level taken by said digital output signal to produce a count signal when said presence signal takes said presence level, said counter means holding a specific count while said presence signal takes said absence level, said specific count being a count to which the clocks of said clock sequence are counted when said presence signal is switched from said presence level to said absence level; and means responsive to said count signal for producing said gain control signal.

2. An automatic gain control amplifier circuit as claimed in claim 1, wherein said counter means comprises:

a level comparator for comparing said amplified level with a reference level to produce a comparison result signal which takes a first and a second level when said amplified level is higher and lower than said reference level, respectively;

an AND circuit enabled to allow the clocks of said clocks sequence to pass therethrough only when said presence signal takes said presence level; and an up-down counter preset to a predetermined count upon energization of a power source for said automatic gain control amplifier circuit and capable of counting the clocks supplied through said AND circuit up and down from said predetermined count when said comparison result signal takes a predetermined one and the other of said first and said second levels, respectively, said up-down counter thereby making said count signal represent a count to which the clocks of said clock sequence are counted from time to time, said up-down counter holding, as said specific count, the count to which the clocks of said clock sequence are counted at the instant at which said presence signal is switched from said presence level to said absence level.

3. An automatic gain control amplifier circuit as claimed in claim 2 said gain control signal being for controlling said amplified level to an optimum level predetermined in common for the digital output signals into which the respective digital input signals of said intermittent sequence are amplified, wherein said reference level is rendered substantially equal to said optimum level.

4. An automatic gain control amplifier circuit for an intermittent sequence of digital input signals, comprising variable gain amplifying means responsive to a gain control signal for amplifying each digital input signal to produce a digital output signal and control signal producing means responsive to said digital output signal for producing said gain control signal, wherein said control signal producing means comprises:

first means responsive to said digital output signal for detecting presence and absence of the digital input signal in said intermittent sequence to produce a presence signal which takes a presence and an absence level when the digital input signal is present and absent in said intermittent sequence, respectively; and second means responsive to said digital output signal and said presence signal for producing said gain control signal when said presence signal takes said presence level, said second means making said gain control signal keep a specific value while said presence signal takes said absence level, said specific value being had by said gain control signal at an instant at which said presence signal is switched from said presence level to said absence level;

wherein said second means comprises;

a clock regenerator responsive to said digital output signal for regenerating a clock sequence of clocks of the digital input signal amplified into said digital output signal;

counter means responsive to said digital output signal and said presence signal for counting the clocks of said clock sequence in consideration of an amplified level taken by said digital output signal to produce a count signal when said presence signal takes said presence level, said counter means holding a specific count while said presence signal takes said absence level, said specific count being a count to which the clocks of said clock sequence are counted when said presence signal is switched from said presence level to said absence level; and means responsive to said count signal for producing said gain control signal; and wherein said counter means comprises;

a level comparator for comparing said amplified level with a reference level to produce a comparison result signal which takes a first and a second level when said amplified level is higher and lower than said reference level, respectively;

an AND circuit enabled to allow the clocks of said clock sequence to pass therethrough only when said preence signal takes said presence level; and an up-down counter preset to a predetermined count upon energization of a power source for said automatic gain control amplifier circuit and capable of counting the clocks supplied through said AND circuit up and down from said predetermined count when said comparison result signal takes a predetermined one and the other of said first and said second levels, respectively, said up-down counter thereby making said count signal represent a count to which the clocks of said clock sequence are counted from time to time, said up-down counter holding, as said specific count, the count to which the clocks of said clock sequence are counted at the instant at which said presence signal is switched from said presence level to said absence level.

5. An automatic gain control amplifier circuit as claimed in claim 4, said gain control signal being for controlling said amplified level to an optimum level predetermined in common for the digital output signals into which the respective digital input signals of said intermittent sequence are amplified, wherein said reference level is rendered substantially equal to said optimum level.

* * * * *

UNITED STATES PATENT AND TRADEMARK OFFICE
CERTIFICATE OF CORRECTION

PATENT NO. : 4,489,281
DATED : December 18, 1984
INVENTOR(S) : Mikio KIYONO

It is certified that error appears in the above-identified patent and that said Letters Patent is hereby corrected as shown below:

Column 5, line 63, delete "arravial" and insert therefor --arrival--;

Column 7, line 6, delete "contral" and insert therefor --control--;

Column 10, line 43, delete "preence" and insert therefor --presence--.

Signed and Sealed this

Twentieth Day of August 1985

[SEAL]

Attest:

DONALD J. QUIGG

Attesting Officer

Acting Commissioner of Patents and Trademarks